US006869862B2

(12) United States Patent
Kirkpatrick et al.

(10) Patent No.: US 6,869,862 B2
(45) Date of Patent: Mar. 22, 2005

(54) METHOD FOR IMPROVING A PHYSICAL PROPERTY DEFECT VALUE OF A GATE DIELECTRIC

(75) Inventors: Brian K. Kirkpatrick, Allen, TX (US); Mercer Brugler, Flower Mound, TX (US); Eddie Breashears, Lucas, TX (US); Jon Holt, Plano, TX (US); Corbett Zabierek, Dallas, TX (US); Rajesh Khamankar, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/637,288

(22) Filed: Aug. 8, 2003

(65) Prior Publication Data

US 2004/0029391 A1 Feb. 12, 2004

Related U.S. Application Data

(60) Provisional application No. 60/402,592, filed on Aug. 9, 2002, and provisional application No. 60/406,839, filed on Aug. 29, 2002.

(51) Int. Cl.$^7$ ............... H01I 21/46; H01I 21/78; H01I 21/326; H01L 21/479
(52) U.S. Cl. ............... 438/463; 438/474
(58) Field of Search ............... 438/463, 258, 438/275, 289, 471, 475, 474, 535, 662, 663, 775, 776, 795, 798, 799

(56) References Cited

U.S. PATENT DOCUMENTS

| | | | | |
|---|---|---|---|---|
| 5,596,218 A | * | 1/1997 | Soleimani et al. | 257/369 |
| 6,456,104 B1 | * | 9/2002 | Guarin et al. | 324/769 |
| 6,521,469 B1 | * | 2/2003 | La Rosa et al. | 438/17 |
| 6,544,853 B1 | * | 4/2003 | Lin | 438/305 |
| 6,653,856 B1 | * | 11/2003 | Liu | 324/765 |
| 6,780,720 B2 | * | 8/2004 | Burnham et al. | 438/287 |
| 6,780,730 B2 | * | 8/2004 | Lin | 438/424 |

* cited by examiner

Primary Examiner—David Nhu
(74) Attorney, Agent, or Firm—Peter K. McLarty; W. James Brady III; Frederick J. Telecky, Jr.

(57) ABSTRACT

The present invention provides a method for improving a physical property of a substrate, a method for manufacturing an integrated circuit, and an integrated circuit manufactured using the aforementioned method. In one aspect of the invention, the method for improving a physical property of a substrate includes subjecting the substrate to effects of a plasma process 830, wherein the substrate has a physical property defect value associated therewith subsequent to the plasma process. The method further includes exposing the substrate to an ultraviolet (UV) energy source 840 to improve the physical property defect value.

30 Claims, 10 Drawing Sheets

| Element | K(eV) 1s | L-I 2s | L-II 2p1/2 | L-III 2p3/2 | M-I 3s | M-II 3p1/2 | M-III 3p3/2 | M-IV 3d3/2 | M-V 3d5/2 | N-I 4s | N-II 4p1/2 | N-III 4p3/2 |
|---|---|---|---|---|---|---|---|---|---|---|---|---|
| 1 H | 13.6 | | | | | | | | | | | |
| 2 He | 24.6* | | | | | | | | | | | |
| 3 Li | 54.7* | | | | | | | | | | | |
| 4 Be | 111.5* | | | | | | | | | | | |
| 5 Be | 188* | | | | | | | | | | | |
| 6 C | 284.2* | | | | | | | | | | | |
| 7 N | 409.9* | 37.3* | | | | | | | | | | |
| 8 O | 543.1* | 41.6* | | | | | | | | | | |
| 9 F | 696.7* | | | | | | | | | | | |
| 10 Ne | 870.2* | 48.5* | 21.7* | 21.6* | | | | | | | | |
| 11 Na | 1070.8* | 63.5⁺ | 30.65 | 30.81 | | | | | | | | |
| 12 Mg | 1303* | 88.7 | 49.78 | 49.5 | | | | | | | | |
| 13 Al | 1559.6 | 117.8* | 72.95 | 72.55 | | | | | | | | |
| 14 Si | 1839 | 149.7* | 99.82 | 99.42 | | | | | | | | |

***(Values are take from J. A. Bearden and A. F. Burr, "Reevaluation of X-Ray Atomic Energy Levels," Rev. Mod. Phys. 39, (1967) p.125, except values marked '*' are from M. Cardona and L. Ley, Eds., Photoemission in Solids I: General Principles (Springer-Verlag, Berlin, 1978) with additional corrections, and values marked with '+' are from J. C. Fuggle and N. Mårtensson, "Core-Level Binding Energies in Metals," J. Electron Spectrosc. Relat. Phenom. 21, (1980) p.275.)

FIGURE 1

GOI Results

| LOT | WAFER | GOI_3NTB_Delta | GOI_3NTF_Delta | GOI_3NTM_Delta | GOI_3PTB_Delta | GOI_3PTF_Delta | GOI_3PTM_Delta | Temp (deg C) | Time (min) | |
|---|---|---|---|---|---|---|---|---|---|---|
| 9968919 | D-9968919-03 | 0.22 | 0.45 | -0.30 | 0.11 | -0.02 | -0.05 | 50 | 4 | Average D |
| 9968919 | D-9968919-03 | 0.33 | 0.18 | 0.41 | -0.20 | 0.07 | 0.08 | 50 | 4 | Stdev De |
| 9968919 | D-9968919-05 | -0.14 | 0.47 | -0.13 | 0.03 | -0.04 | -0.01 | 50 | 8 | Average D |
| 9968919 | D-9968919-05 | 0.08 | -0.34 | -0.47 | 0.06 | 0.09 | -0.02 | 50 | 8 | Stdev De |
| 9968919 | D-9968919-06 | 0.17 | -0.22 | 0.32 | 0.00 | 0.01 | -0.04 | 50 | 4 | Average D |
| 9968919 | D-9968919-06 | 0.65 | -0.10 | -0.92 | -0.05 | 0.01 | -0.05 | 50 | 4 | Stdev De |
| 9968919 | D-9968919-15 | 0.22 | 0.70 | -0.34 | -0.03 | 0.08 | 0.05 | 50 | 8 | Average D |
| 9968919 | D-9968919-15 | -0.08 | -0.13 | 0.78 | -0.02 | -0.13 | -0.02 | 50 | 8 | Stdev De |
| 9968919 | D-9968919-16 | 0.03 | 0.46 | 0.33 | -0.03 | -0.04 | 0.07 | 240 | 4 | Average D |
| 9968919 | D-9968919-16 | -0.52 | 0.27 | -0.54 | 0.04 | 0.04 | -0.01 | 240 | 4 | Stdev De |
| 9968919 | D-9968919-17 | 0.21 | -0.07 | -0.33 | 0.02 | -0.01 | 0.05 | 240 | 8 | Average D |
| 9968919 | D-9968919-17 | 0.81 | -0.03 | 0.55 | -0.01 | 0.01 | -0.07 | 240 | 8 | Stdev De |
| 9968919 | D-9968919-18 | 0.08 | -0.54 | 0.13 | 0.07 | 0.07 | -0.04 | 240 | 4 | Average D |
| 9968919 | D-9968919-18 | -0.18 | -0.40 | -0.32 | -0.09 | -0.09 | -0.09 | 240 | 4 | Stdev De |
| 9968919 | D-9968919-21 | 0.06 | 0.20 | 0.61 | 0.08 | -0.04 | -0.10 | 240 | 8 | Average D |
| 9968919 | D-9968919-21 | 0.18 | 0.11 | -1.05 | -0.04 | 0.01 | -0.02 | 240 | 8 | Stdev De |
| 9968919 | D-9968919-23 | 0.18 | 0.95 | 0.14 | -0.10 | 0.01 | 0.03 | control | control | Average D |
| 9968919 | D-9968919-23 | -0.55 | -0.17 | -0.40 | -0.01 | -0.02 | 0.00 | control | control | Stdev De |

| Temp (deg C) | Time (min) | | | | | | | | | |
|---|---|---|---|---|---|---|---|---|---|---|
| 50 | 4 | 0.20 | 0.12 | 0.01 | 0.05 | -0.01 | -0.05 | | | Average Delta |
| 50 | 4 | -0.49 | -0.14 | -0.25 | -0.12 | 0.04 | 0.01 | | | Std Dev Delta |
| 50 | 8 | 0.04 | 0.59 | -0.24 | 0.00 | 0.02 | 0.02 | | | Average Delta |
| 50 | 8 | -0.08 | -0.24 | 0.63 | 0.04 | -0.02 | 0.00 | | | Std Dev Delta |
| 240 | 4 | 0.05 | -0.04 | 0.23 | 0.02 | 0.01 | 0.01 | | | Average Delta |
| 240 | 4 | -0.35 | 0.34 | -0.43 | -0.03 | -0.03 | -0.06 | | | Std Dev Delta |
| 240 | 8 | 0.13 | 0.07 | 0.14 | 0.05 | -0.02 | -0.02 | | | Average Delta |
| 240 | 8 | -0.48 | -0.07 | -0.25 | -0.03 | 0.01 | -0.02 | | | Std Dev Delta |

GOI Key:
GOI_3NTB

FIGURE 6

METHOD FOR IMPROVING A PHYSICAL PROPERTY DEFECT VALUE OF A GATE DIELECTRIC

CROSS-REFERENCE TO PROVISIONAL APPLICATION

This application claims the benefit of U.S. Provisional Application No. 60/402,592 entitled "HEALING PLASMA DAMAGE USING ULTRA-VIOLET RADIATION," to Kirkpatrick, et al., filed on Aug. 9, 2002 and U.S. Provisional Application No. 60/406,839 entitled "HEALING PLASMA DAMAGE USING ULTRA-VIOLET RADIATION," to Kirkpatrick, et al., filed on Aug. 29, 2002, which are both commonly assigned with the present invention and incorporated herein by reference as if reproduced herein in their entirety.

TECHNICAL FIELD OF THE INVENTION

The present invention is directed, in general, to a method for manufacturing a substrate or an integrated circuit and, more specifically, to a method for improving a physical property defect value of a substrate in an integrated circuit, and an integrated circuit manufactured using the method.

BACKGROUND OF THE INVENTION

As the semiconductor industry continues to improve its process technologies, meeting circuit reliability metrics is becoming increasingly difficult. One circuit reliability metric that has experienced growing concern is that of the Gate Oxide Integrity (GOI).

GOI can be degraded by many factors. Currently, one of the most significant factors in degrading GOI is plasma damage to the gate dielectric. This plasma damage often results from any one of the numerous process steps that presently use plasma. For example, plasma processes can induce damage in the gate dielectrics, resulting in degradation of MOS characteristics due to a buildup of silicon-oxide interface states or oxide traps, or lead to early oxide breakdown. Since the number of process steps using plasma is increasing as the industry attempts to improve its process technologies, the degree to which the industry can control, limit or repair plasma damage, directly correlates to the ability to meet reliability requirements.

Currently there are two major approaches to reducing plasma damage in integrated circuits. The first approach includes eliminating plasma damage at its source by optimizing process and hardware parameters on the plasma tools. Unfortunately, the industry has optimized the process and hardware parameters about as much as it can. The other approach includes mitigating the severity of the plasma damage after it has already occurred by terminating the broken bonds using hydrogen or deuterium gas. Often this damage can likely reappear during the device's operating life, or show up during electrical or thermal stresses, which result in depassivation of the hydrogen. Another approach includes adding additional anneals to the manufacturing process. This approach, however, comes at the cost of additional thermal cycles and increased hydrogen concentration in the chips. Unfortunately, increased hydrogen concentrations have been linked to film delamination problems.

Accordingly, what is needed in the art is an integrated circuit or method of manufacturing an integrated circuit that does not experience the extent of plasma damage experienced in the prior art integrated circuits and methods of manufacture therefor.

SUMMARY OF THE INVENTION

To address the above-discussed deficiencies of the prior art, the present invention provides a method for improving a physical property of a substrate, a method for manufacturing an integrated circuit, and an integrated circuit manufactured using the aforementioned method. In one aspect of the invention, the method for improving a physical property of a substrate includes subjecting the substrate to effects of a plasma process, wherein the substrate has a physical property defect value associated therewith subsequent to the plasma process. The method further includes exposing the substrate to an ultraviolet (UV) energy source to improve the physical property defect value.

An alternative aspect of the present invention provides a method for manufacturing an integrated circuit. The method for manufacturing the integrated circuit includes forming a gate dielectric over a semiconductor substrate and then subjecting the gate dielectric to effects of a plasma process. In this instance, the gate dielectric has a physical property defect value associated therewith subsequent to the plasma process. Then, the gate dielectric is exposed to an ultraviolet (UV) energy source to improve the physical property defect value.

The present invention also provides an integrated circuit. The integrated circuit includes a semiconductor substrate having gate structures located thereover, as well as at least one plasma dielectric located over the semiconductor substrate, wherein the integrated circuit has a negative bias temperature instability (NBTI) shift of less than about 20% for a given operating voltage of 1.8 volts or less.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which:

FIG. 1 illustrates a table depicting binding energies for many of the common elements found within integrated circuits;

FIG. 6 illustrates a table illustrating the GOI level benefits that may be obtained by exposing the gate dielectric to the UV energy source;

DETAILED DESCRIPTION

Figure 2:
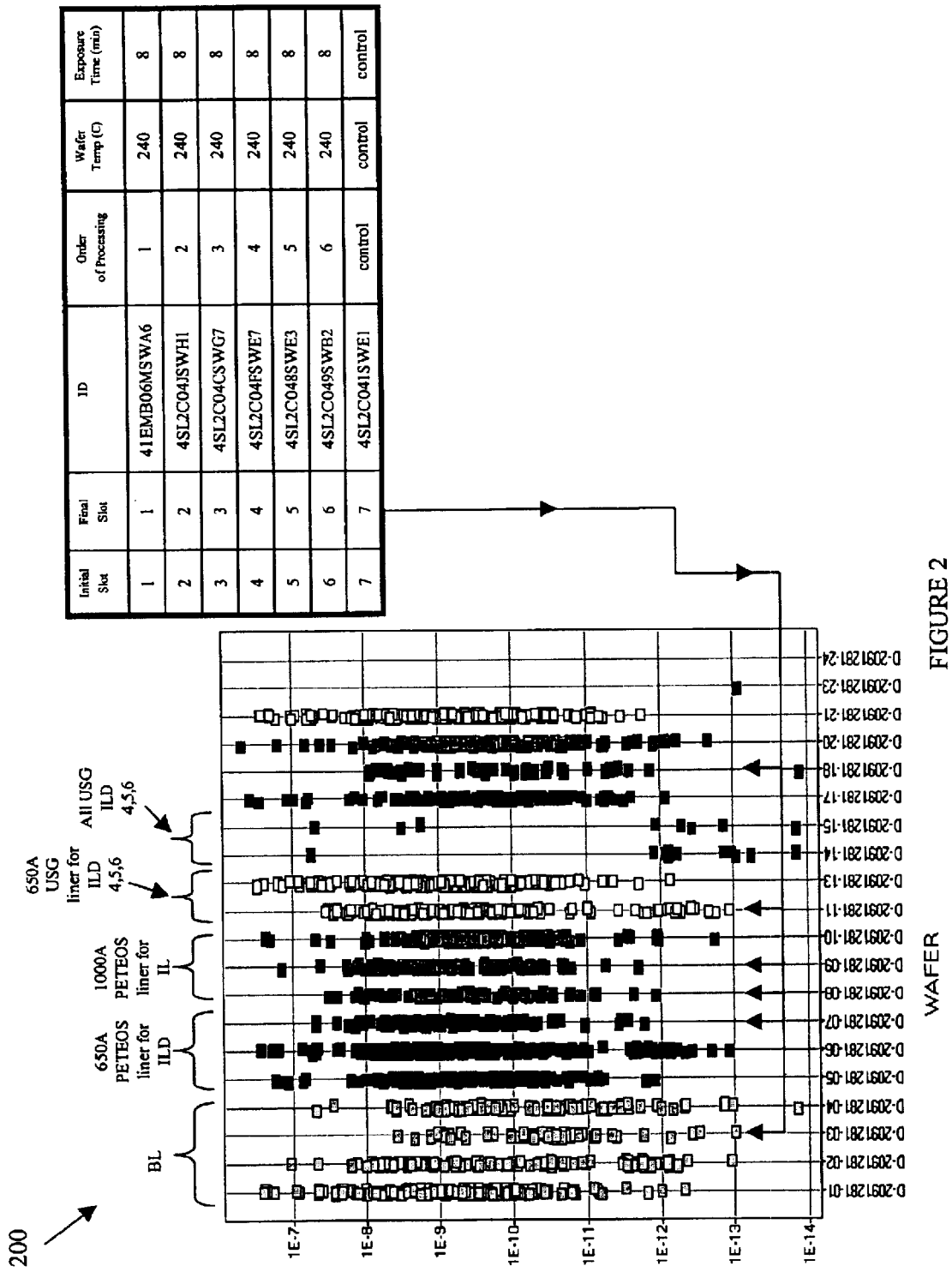
FIG. 2 illustrates a graph depicting the benefits that may be obtained by exposing the gate dielectric to a UV energy source to improve the physical property defect value in accordance with the principles of the present invention.

The present invention addresses the need for accurately and consistently attaining the desired circuit reliability metrics required by today's integrated circuits. As discussed in the background of the invention above, plasma damage induced by any of the plasma processes used in the fabrication of integrated circuits currently has a major impact on the aforementioned circuit reliability metrics. In addition to the plasma damage having a degrading effect on an integrated circuit's Gate Oxide Integrity (GOI) value, it is also believed that the plasma damage has a degrading effect on the integrated circuit's antenna gate leakage value, threshold voltage drift value and the $V_{min}$ value (i.e., the minimum voltage, with maximum frequency, at which the address circuit functions correctly). Additionally, it is theorized that the plasma damage has a degrading effect on the integrated circuit's negative bias temperature instability (NBTI) value.

In contrast to that previously known by those skilled in the art, the present invention encompasses the recognition that an ultraviolet (UV) energy source may be used to fix, patch or heal at least a portion of the damage caused by the aforementioned plasma process. Particularly, the present invention is focused on the previously unrecognized fact that the UV energy source may improve the affected integrated circuit's reliability metrics, or in other words physical property defect values, including its NBTI, GOI, antenna gate leakage, threshold voltage shift and $V_{min}$ values.

The mechanism by which the UV energy source improves the NBTI, GOI, antenna gate leakage, threshold voltage shift and $V_{min}$ values is not fully known. It is theorized that the UV energy source provides the additional energy required to locally excite the electrons proximate the dangling bonds and/or silicon-hydrogen bonds in the gate dielectric material of the integrated circuit. It is believed that once the electrons are sufficiently excited, the electrons will lower their energy by either cascade discharging to a stable energy state or by reestablishing covalent bonds with the surrounding atoms that were previously broken by the plasma damage.

Turning briefly to FIG. 1, illustrated is a table 100 depicting binding energies for many of the common elements found within integrated circuits. As those skilled in the art are aware, the binding energies are quoted relative to the vacuum level for rare gases and $H_2$, $N_2$, $O_2$, $F_2$, and $Cl_2$ molecules, relative to the Fermi level for metals, and relative to the top of the valence band for semiconductors. As discussed above, and supported by the table 100, hydrogen is of concern because its low bond energy allows the bond to break when the integrated circuit is placed under stress. For example, comparing the outer orbital binding energies for hydrogen to the outer orbital binding energies of other favorable elements, such as nitrogen, oxygen and silicon, it is apparent that hydrogen is the weakest of the bonds.

Accordingly, if one were able to break the silicon-hydrogen bonds, and replace those bonds with stronger silicon-nitrogen, silicon-oxygen or silicon-silicon bonds, for example using the UV energy source, the integrated circuit's NBTI, GOI, antenna gate leakage, threshold voltage shift and $V_{min}$ values should improve. Unfortunately, until now no methodology existed for replacing the weaker bonds with stronger bonds without causing other undesirable effects.

Turning now to FIG. 2, illustrated is a graph 200 depicting the benefits that may be obtained by exposing a gate dielectric to a UV energy source to improve the physical property defect value in accordance with the principles of the present invention. The graph 200 of FIG. 2 plots the various leakage current values for a number of wafers, including certain wafers that have undergone the exposure to the UV energy source as well as certain wafers that have not. Notice the tighter distribution of leakage current values for those wafers that have undergone the exposure to the UV energy source.

Figure 3:
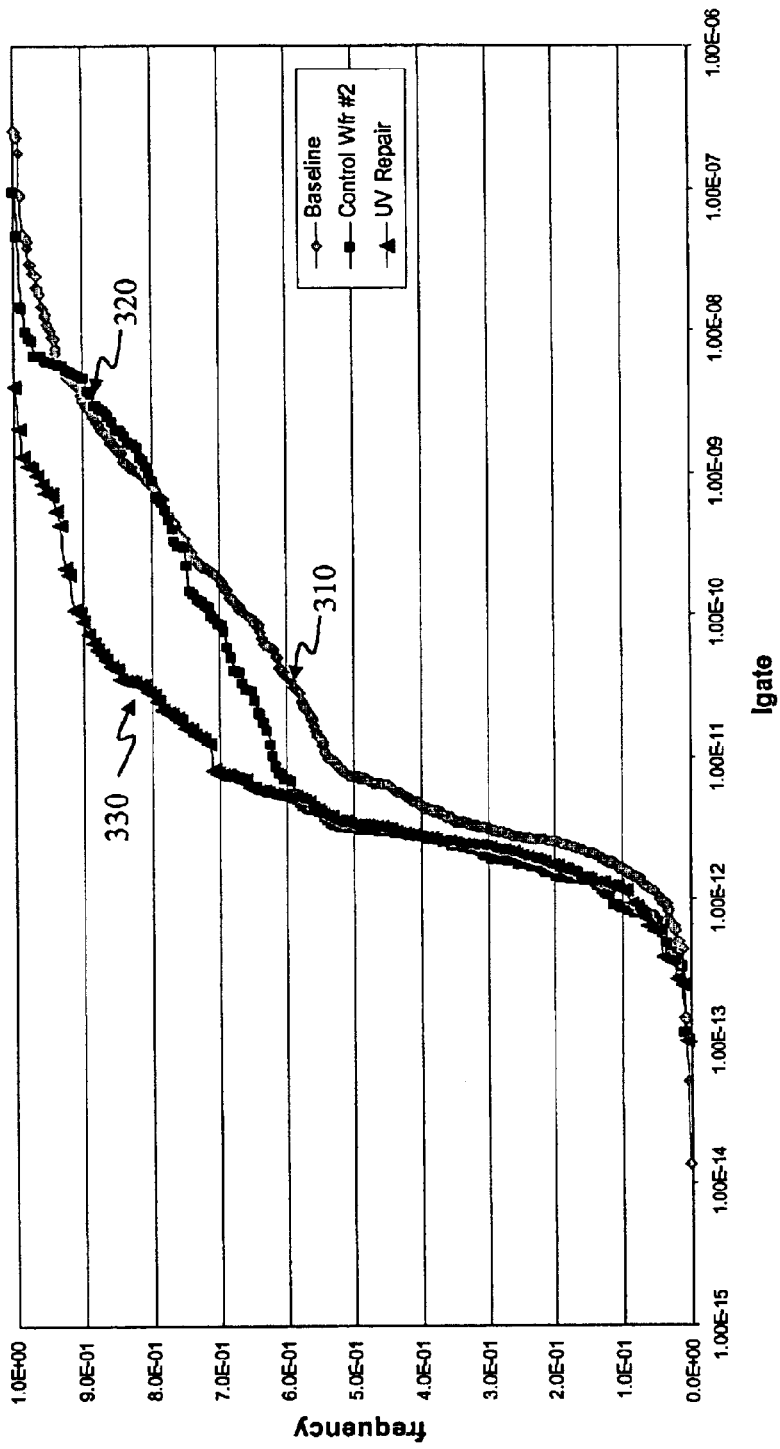
FIG. 3 illustrates a graph comparing measured leakage current values at different frequencies for a baseline wafer, a control wafer and a wafer exposed to the UV energy source.

Turning now to FIG. 3, illustrated is a graph 300 comparing measured leakage current values at different frequencies for a baseline wafer 310, a control wafer 320 and a wafer exposed to the UV energy source 330. The baseline wafer 310 is a standard wafer not having been subjected to the UV energy source. Similarly, the control wafer 320 is a wafer not having been subjected to the UV energy source and that has endured the same handling as the wafer exposed to the UV energy source 330. Notice how the wafer exposed to the UV energy source 330 shows a tighter distribution of sites with low leakage, which corresponds to less damage to the gate dielectric, than both the baseline wafer 310 and control wafer 320.

Figure 4:
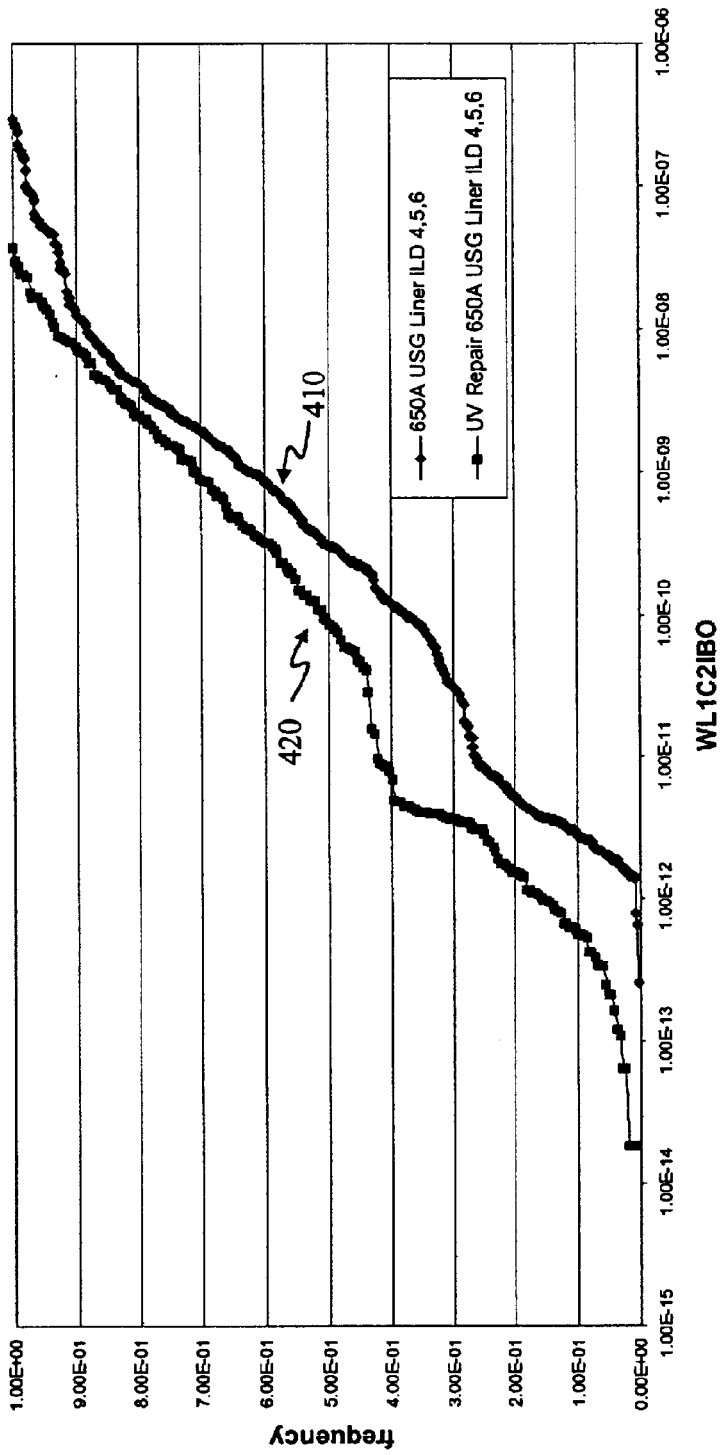
FIG. 4 illustrates a graph comparing measured leakage current values at different frequencies for a baseline wafer, a control wafer and a wafer exposed to the UV energy source, two of which are taken through a 650 Å USG liner plasma deposited as interlevel dielectric layers 4, 5, and 6.

Turning now to FIG. 4, illustrated is a graph 400 comparing measured leakage current values at different frequencies for a non UV treated wafer 410 and a wafer exposed to the UV energy source 420. These measurements were taken after a 650 Å USG liner was plasma deposited as interlevel dielectric layers 4, 5, and 6. Notice how the wafer exposed to the UV energy source 420 shows reduced leakage as compared to the non UV treated wafer 410, indicating some level of repair.

Figure 5:
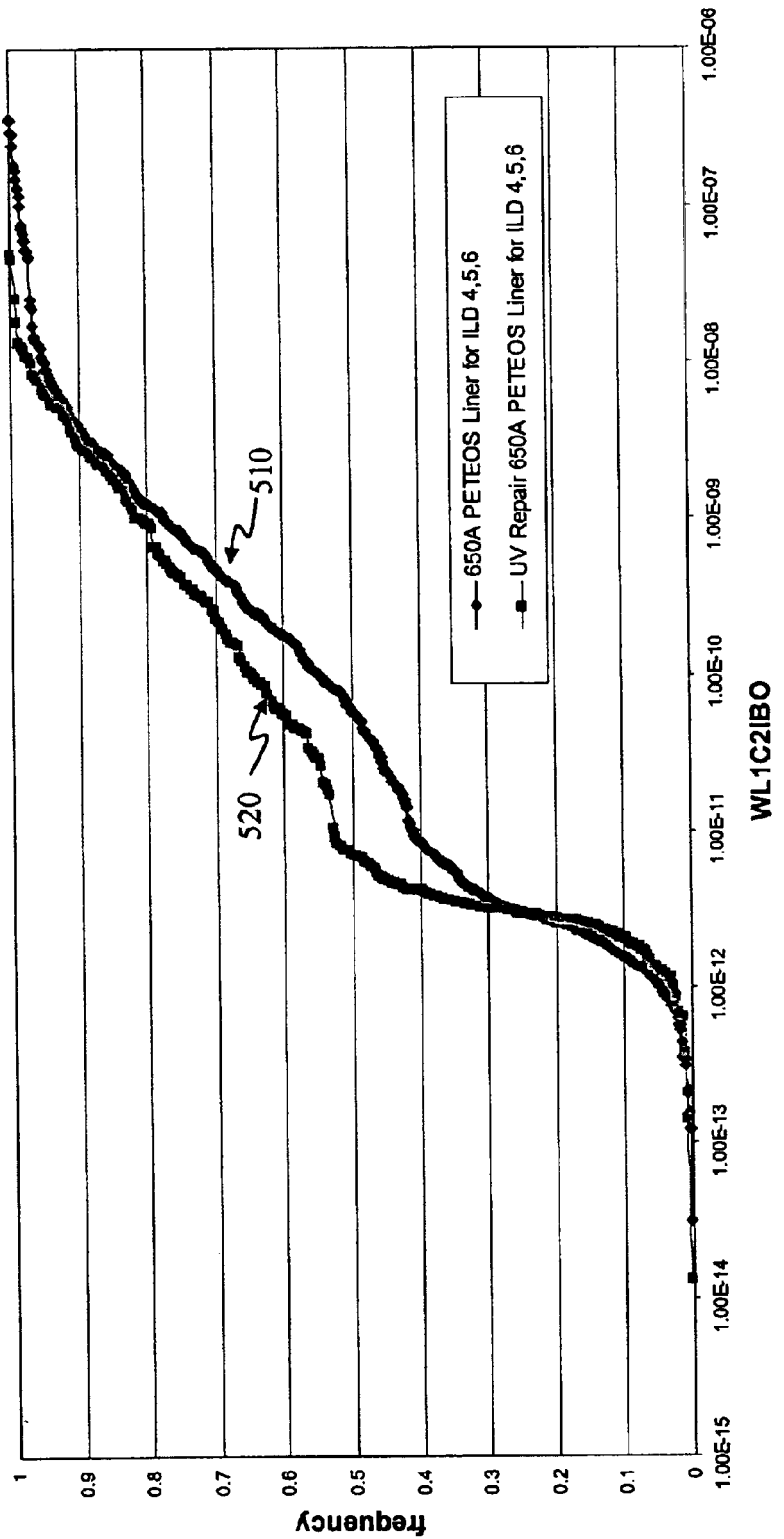
FIG. 5 illustrates a graph comparing measured leakage current values at different frequencies for a baseline wafer, a control wafer and a wafer exposed to the UV energy source, two of which are taken through a 650 Å PETEOS liner plasma deposited as interlevel dielectric layers 4, 5, and 6.

Turning now to FIG. 5, illustrated is a graph 500 comparing measured leakage current values at different frequencies for a non UV treated wafer 510 and a wafer exposed to the UV energy source 520. These measurements were taken after a 650 Å PETEOS liner was plasma deposited as interlevel dielectric layers 4, 5, and 6. The wafer exposed to the UV energy source 520 shows dramatically reduced leakage as compared to the non UV treated wafer 510, indicating a substantial level of repair. Thus, a substantial portion, if not all, of the damage caused by the plasma processes was repaired.

Turning now to FIG. 6, illustrated is a table 600 illustrating the GOI level benefits that may be obtained by exposing the gate dielectric to the UV energy source. Table 600 compares wafers pre and post UV exposure over a number of different exposure conditions. For example, the exposure conditions include 50° C. and 4 minutes, 50° C. and 8 minutes, 240° C. and 4 minutes, and 240° C. and 8 minutes. What results are ramped voltage breakdown values from the wafer averages. A positive average delta (Average Delta) indicates an improvement in GOI, and a negative Standard Deviation (Std Dev Delta) indicates an improvement in distribution. Notice that in almost all instances the wafers experienced improved GOI and distribution values. Again, table 600 further supports the idea that exposing a gate dielectric to a UV energy source improves the gate dielectric's physical property defect values.

Figure 7:
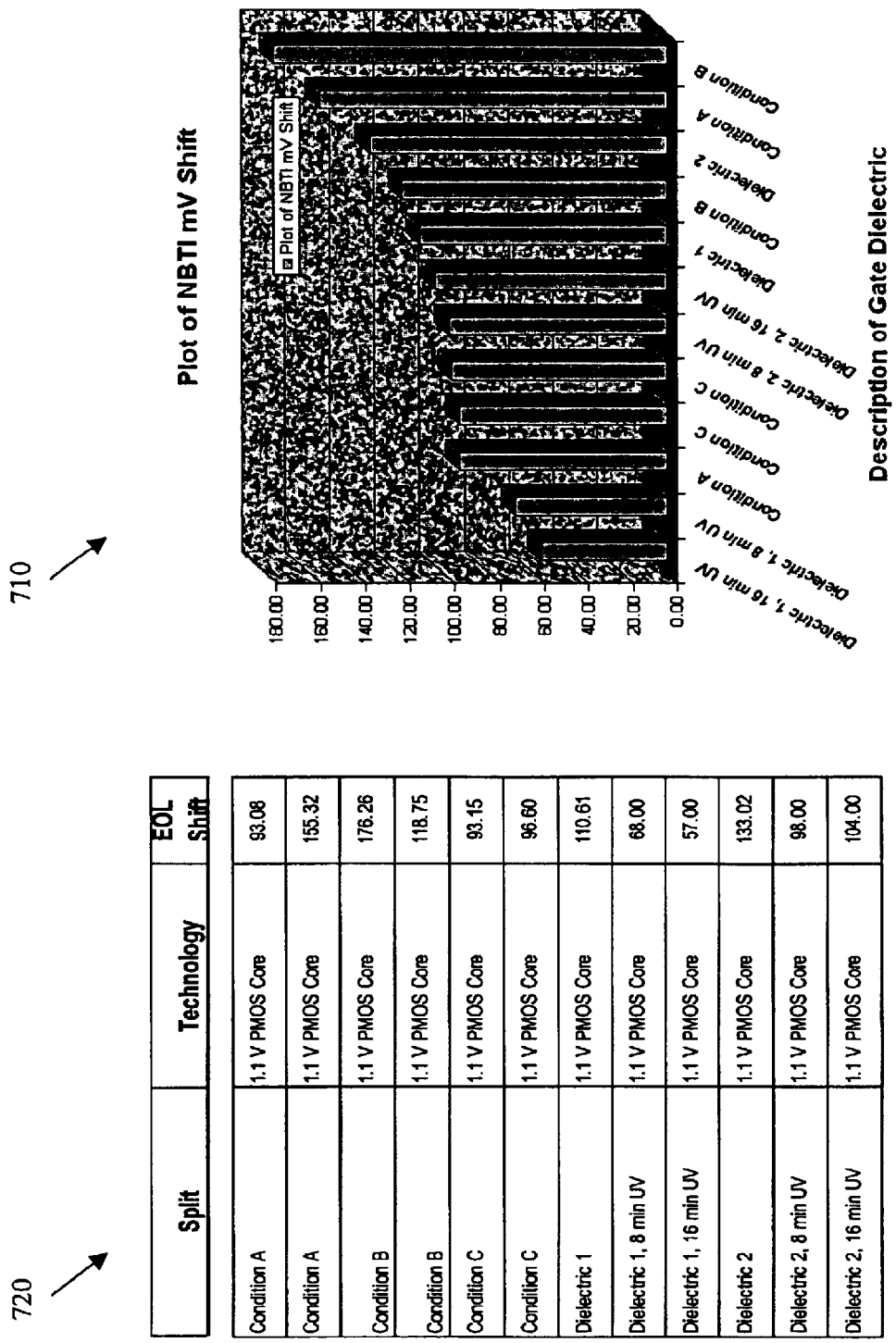
FIG. 7 illustrates a graph and a table illustrating the NBTI level benefits that may be obtained by exposing the gate dielectric to the UV energy source in accordance with the principles of the present invention.

Turning now to FIG. 7, illustrated is a graph 710 and a table 720 illustrating the NBTI level benefits that may be obtained by exposing the gate dielectric to the UV energy source in accordance with the principles of the present invention. As is illustrated, table 720 compares two dielectrics' (dielectric 1 and dielectric 2) NBTI values for two different UV exposure times. Notice the elevated NBTI values for those examples not having experienced the UV exposure. In comparison, however, the NBTI values decrease dramatically with UV exposure. For example, in dielectric 1 the shift in NBTI is reduced by about 50% after only 16 minutes of UV exposure. Similarly, in dielectric 2 the shift in NBTI is reduced by about 25% after only 8 minutes of UV exposure. It is believed that the difference in improvement between dielectric 1 and dielectric 2 is a function of the method used to form the gate dielectric. Graph 710 and table 720, again, establish one of the many benefits that may be achieved by using a UV treatment in accordance with the principles of the present invention.

Figure 8:
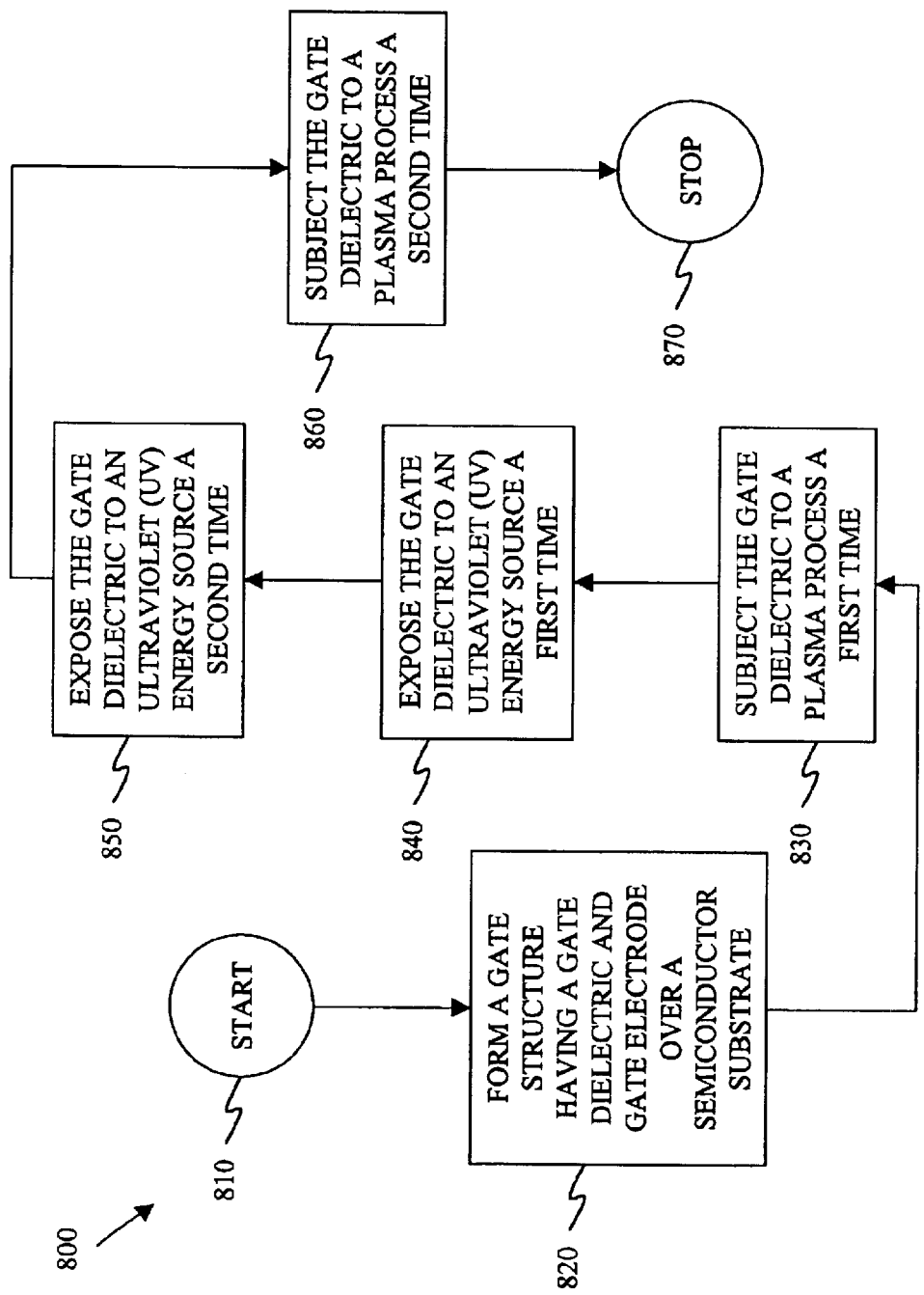
FIG. 8 illustrates a flow diagram illustrating one method by which a physical property of a gate dielectric, and more specifically a physical property defect value of a gate dielectric may be improved.

Turning now to FIG. 8, illustrated is a flow diagram 800 illustrating one method by which a physical property of a gate dielectric, and more specifically a physical property defect value of a gate dielectric may be improved. The flow diagram 800 begins in a start step 810. Thereafter, in a step 820, at least one gate structure having a gate dielectric and a gate electrode is formed over a semiconductor substrate. Often, at this stage of the manufacturing process the gate dielectric has very few, if any, undesirable dangling bonds or silicon-hydrogen bonds.

Thereafter, in a step 830, as is often the case, the gate dielectric is subjected to one or more plasma processes. As discussed above, this plasma process, which may be any plasma process used in the manufacture of integrated circuits, including any plasma deposition or etch process, often causes plasma damage in the gate dielectric. More often than not the plasma damage is located proximate the interface between the gate dielectric and the semiconductor substrate.

The plasma damage may show up in the form of dangling bonds, or if passivated with hydrogen, may show up in the form of weak silicon-hydrogen bonds. Unfortunately, neither the dangling bonds nor the weak silicon-hydrogen bonds are desired in today's integrated circuits, as they cause the gate dielectric to have a sub-par physical property defect value. In other words, the plasma damage causes the gate dielectric's circuit reliability metrics, such as NBTI, GOI, antenna gate leakage, threshold voltage shift and $V_{min}$ values to degrade.

Accordingly, in a step 840, the gate dielectric is exposed to a UV energy source. Unbeknownst to those skilled in the art, and as established above, the UV energy source improves the physical property defect value of the gate dielectric. The UV energy source may be supplied by a number of different techniques, however, in one particularly advantageous embodiment the UV energy source is supplied by a UV bulb. For example, commercially available equipment built for FLASH EEPROM erasure or UV light stabilization of photoresist, each having a UV bulb, could be used to expose the gate dielectric. One known FLASH EEPROM erasure tool may be purchased from Axcelis Technologies, located at 55 Cherry Hill Drive, Beverly, Mass. 01915-1053.

Certain embodiments of the present invention have the UV energy source supplying individual wavelengths ranging from about 138 nm to about 400 nm, and more specifically 190 nm and about 400 nm. These wavelengths are particularly advantageous because they provide superior physical property defect values with minimal damage to the gate dielectric than other wavelengths within the broad UV range. Other embodiments of the invention, however, have the UV energy source supplying a broad spectrum of wavelengths ranging from about 190 nm to about 400 nm. In one advantageous embodiment, the broad spectrum of wavelengths ranging from about 190 nm to about 240 nm provides over about 50% of an energy supplied by the aforementioned broad spectrum. While certain wavelength values for the UV energy source have been listed, other UV wavelength values are equally applicable.

The gate dielectric may also be exposed to the UV energy source for a wide range of different time periods. For example, it is believed that time periods ranging from about 2 minutes to about 20 minutes are sufficient to see dramatic improvements in the physical property defect values discussed above. It is further believed, however, that the narrower time period ranging from about 8 minutes to about 16 minutes provides equally impressive results. While an optimum time period may exist, that time period would most likely be tailored to the amount of plasma damage, the number of layers of material the UV energy source must penetrate, and so on.

Similarly, the gate dielectric material may be positioned within a heated environment while it is exposed to the UV energy source. The heated environment generally allows the time period upon which the gate dielectric is exposed to the UV energy source to be reduced. For example, it has been observed that temperatures ranging from about 50° C. to about 400° C., and more particularly, temperatures ranging from about 180° C. to about 400° C., are helpful in reducing the exposure time.

After exposing the gate dielectric to the UV energy source, and in an optional step 850, the gate dielectric may be subjected to a plasma process a second time. Thereafter, in an optional step 860, the gate dielectric might be exposed to the UV energy source a second time to correct any damage caused by the optional step 850, or any untreated damage from prior processes. The theory is that the process flow for manufacturing an integrated circuit often includes a number of plasma processes, each having a negative impact on the physical property defect values thereof. Accordingly, multiple exposure steps may be required to correct the plasma damage. It can be envisioned where up to about 10 UV exposure steps, and more likely from about 2 to about 6 exposure steps, might be required or desired to correct the damage caused by the plasma processes.

It can be envisioned where the UV exposure occurs through a number of different layers formed over the gate dielectric. For example, it can be envisioned where the final exposure occurs after the integrated circuit device is almost complete. This does not pose a problem for the present invention as the UV energy is capable of penetrating or diffracting around all of these layers and still contacting the gate dielectric.

Sometime after the final exposure step has been completed, the process ends in a stop step 870. While only seven steps were disclosed in the aforementioned flow diagram 800, those skilled in the art understand that a number of other steps could, and most probably would, be interposed between any of the listed steps.

The advantages of using the present invention are almost limitless. First, the UV exposure process of the present invention can be performed at any point in the process flow. Further, it does not result in increased levels of hydrogen. Similarly, it does not result in the addition of added thermal cycles that would result in dopant redistribution. Also, it does not significantly increase the thermal stress, which limits the possibilities for film delamination or copper migration.

Figure 9:
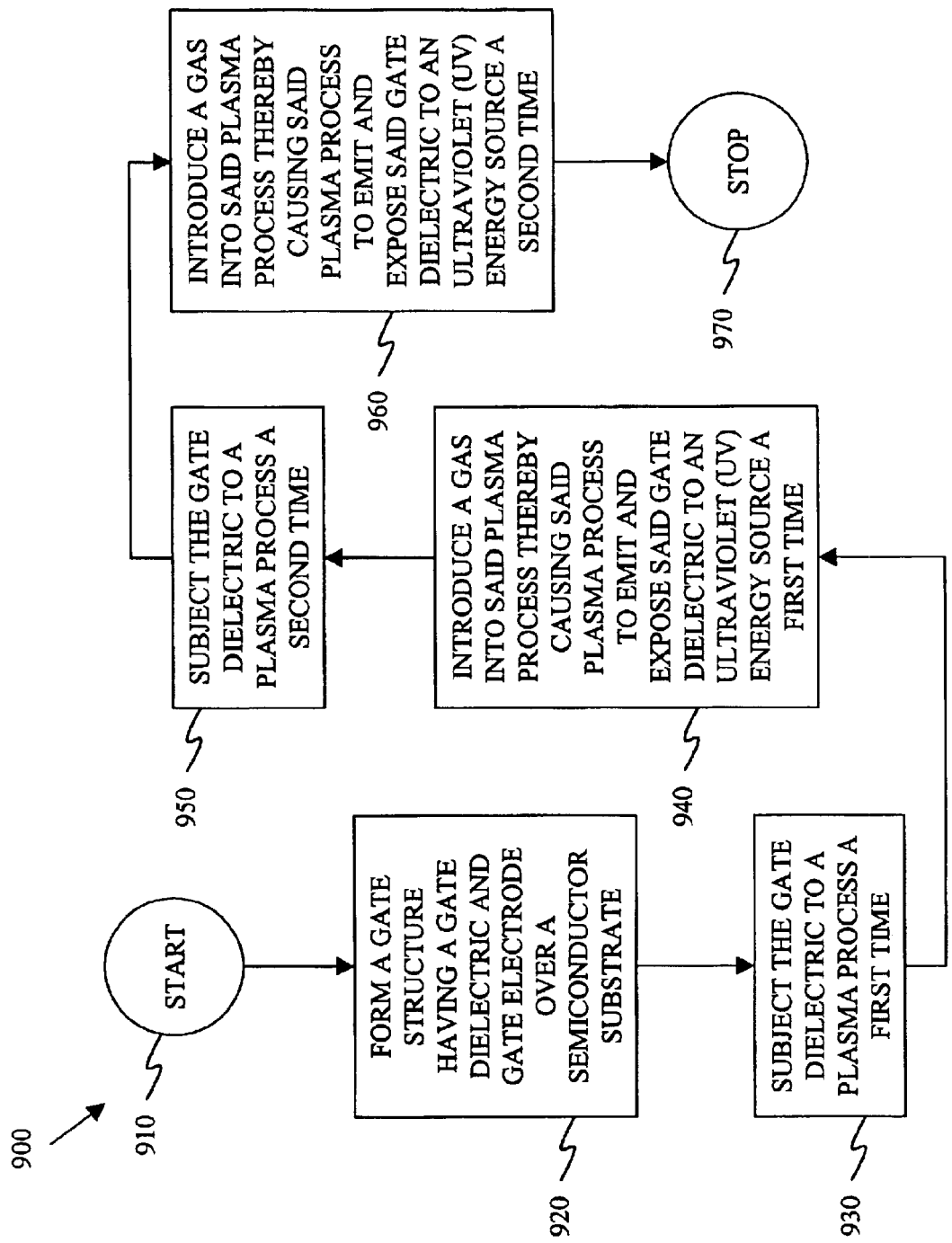
FIG. 9 illustrates a flow diagram illustrating an alternative method by which a physical property of a gate dielectric, and more specifically a physical property defect value of a gate dielectric may be improved.

Turning now to FIG. 9, illustrated is a flow diagram 900 illustrating an alternative method by which a physical property of a gate dielectric, and more specifically a physical property defect value of a gate dielectric may be improved. The flow diagram 900 begins in a start step 910. Thereafter, in a step 920, at least one gate structure having a gate dielectric and a gate electrode is formed over a semiconductor substrate.

Thereafter, in a step 930, as is often the case, the gate dielectric is subjected to one or more plasma processes. As discussed above, this plasma process, which may be any plasma process used in the manufacture of integrated circuits, often causes plasma damage in the gate dielectric. To correct this damage, and in a step 940, a gas is introduced into the plasma process thereby causing the plasma process to emit an ultraviolet (UV) energy source. The ultraviolet energy source, as disclosed above, then improves the physical property defect value of the gate dielectric. The gas, which may include gases such as helium, neon, argon, krypton, xenon, and other similar gasses, preferably produces wavelengths ranging from about 138 nm to about 400 nm.

After exposing the gate dielectric to the UV energy source, and in an optional step 950, the gate dielectric may be subjected to a plasma process a second time. Thereafter, in an optional step 960, the gas may be introduced into the second plasma process, again causing the plasma process to emit an ultraviolet (UV) energy source. This process could then terminate with a stop step 970.

Some advantages of this embodiment of the invention include the ability to expose the gate dielectric to the UV energy source without removing it from the plasma process chamber. Additionally, it allows companies to use their existing plasma processing equipment to expose their wafers to the desired UV energy source. This alone, is a large cost savings over the other embodiment discussed with respect to FIG. 8.

While FIGS. 8 and 9 illustrate two different processes for providing the UV energy source, those skilled in the art understand that such processes may be combined, and stay within the scope of the present invention. For example, those skilled in the art understand that a UV bulb could be placed within the plasma chamber, thus allowing the combination of the UV bulb and the gas introduced within the plasma chamber to provide the UV energy source. Such a combination could be very useful.

Figure 10:
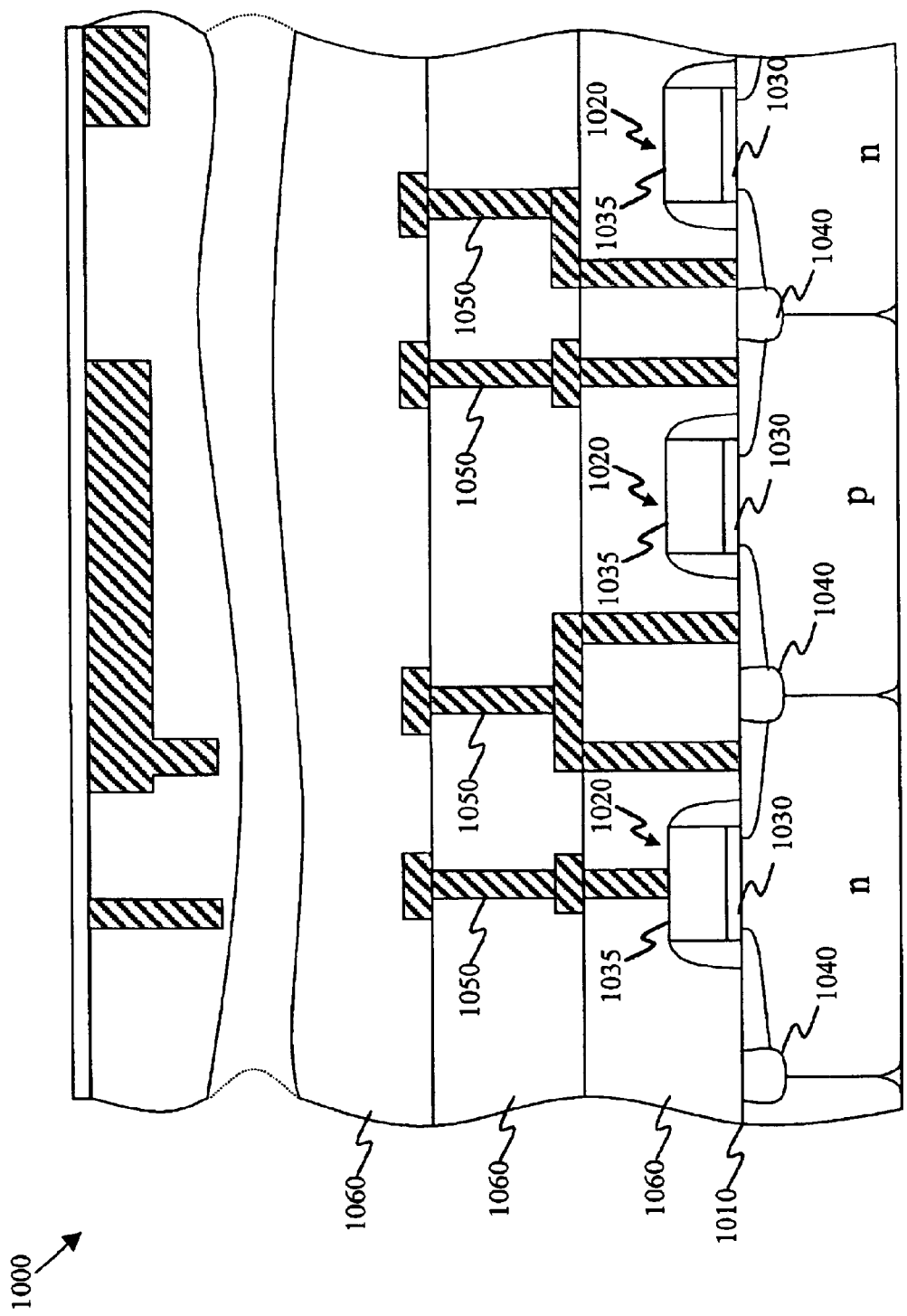
FIG. 10 illustrates a cross-sectional view of an integrated circuit that might be manufactured according to the principles of the present invention.

Turning now to FIG. 10, illustrated is a cross-sectional view of an integrated circuit 1000 that might be manufactured according to the principles of the present invention. The integrated circuit 1000 of FIG. 10 includes a number of gate structures 1020, each having a gate oxide 1030 and gate electrode 1035, located over a substrate 1010. As shown, field oxide structures 1040 may be located along the surface of the substrate 1010, electrically isolating the various gate structures 1020 from one another. Also shown in FIG. 10 are interconnect structures 1050 located in dielectric layers 1060, wherein the interconnect structures 1050 connect the gate structures 1020 to other areas of the integrated circuit 1000 creating an operative integrated circuit. At least one layer included within the integrated circuit 1000 must be a plasma dielectric. That is, at least one layer within the integrated circuit must be a dielectric layer formed using a plasma process. In the embodiment shown in FIG. 10, one of the dielectric layers 1060 is a plasma dielectric layer. For example, some known examples of plasma dielectric layers include fluorosilicate glass (FSG), organosilicate glass (OSG), phosphosilicate glass (PSG), undopedsilicate glass (USG), PETEOS, PENitride, and others.

In direct contrast to the prior art structures, however, the integrated circuit 1000 has a negative bias temperature instability (NBTI) shift of less than about 20% for a given operating voltage of 1.8 volts or less. Similarly, in one exemplary embodiment, the integrated circuit 1000 has a negative bias temperature instability (NBTI) shift of less than about 10% for the given operating voltage of 1.8 volts or less. In another exemplary embodiment, however, the integrated circuit has a negative bias temperature instability (NBTI) shift of less than about 10% for a given operating voltage of 1.5 volts or less.

Although the present invention has been described in detail, those skilled in the art should understand that they can make various changes, substitutions and alterations herein without departing from the spirit and scope of the invention in its broadest form.

What is claimed is:

1. A method for improving a physical property of a substrate, comprising:
   subjecting a substrate to effects of a plasma process, said substrate having a physical property defect value associated therewith subsequent to said subjecting; and
   exposing said substrate to an ultraviolet (UV) energy source to improve said physical property defect value.

2. The method as recited in claim 1 wherein exposing said substrate to an ultraviolet (UV) energy source includes exposing said substrate to an ultraviolet (UV) energy source in a heated environment.

3. The method as recited in claim 2 wherein said heated environment ranges from about 50° C. to about 400° C.

4. The method as recited in claim 1 wherein exposing said substrate to an ultraviolet (UV) energy source includes exposing said substrate to an ultraviolet (UV) energy source having a wavelength ranging from about 190 nm to about 400 nm.

5. The method as recited in claim 4 wherein exposing said substrate to an ultraviolet (UV) energy source having a wavelength ranging from about 190 nm to about 400 nm includes exposing said substrate to an ultraviolet (UV) energy source having a broad spectrum of wavelengths ranging from about 190 nm to about 400 nm, with the wavelengths ranging from about 190 nm to about 240 nm providing over about 50% of an energy of said broad spectrum.

6. The method as recited in claim 1 wherein exposing said substrate to an ultraviolet (UV) energy source includes exposing said substrate to an ultraviolet (UV) energy source for a time period ranging from about 2 minutes to about 20 minutes.

7. The method as recited in claim 6 wherein exposing said substrate to an ultraviolet (UV) energy source for a time period ranging from about 2 minutes to about 20 minutes includes exposing said substrate to an ultraviolet (UV) energy source for a time period ranging from about 8 minutes to about 16 minutes.

8. The method as recited in claim 1 wherein improving said physical property defect value includes improving a negative bias temperature instability (NBTI) value.

9. The method as recited in claim 1 wherein improving said physical property defect value includes improving an antenna gate leakage value.

10. The method as recited in claim 1 wherein improving said physical property defect value includes improving a physical property defect value selected from the group consisting of:

gate oxide integrity (GOI), threshold voltage drift, and $V_{min}$.

11. The method as recited in claim 1 wherein exposing said substrate to an ultraviolet (UV) energy source includes exposing said substrate to an ultraviolet (UV) energy source using an ultraviolet (UV) bulb.

12. The method as recited in claim 1 wherein exposing said substrate to an ultraviolet (UV) energy source includes introducing a gas into said plasma process thereby causing said plasma process to emit said ultraviolet (UV) energy source.

13. The method as recited in claim 12 wherein said gas comprises a gas selected from the group consisting of:

helium, neon, argon, krypton, and xenon.

14. A semiconductor device manufactured using the method of claim 1.

15. A method for manufacturing an integrated circuit, comprising:

forming a gate dielectric over a semiconductor substrate;

subjecting said gate dielectric to effects of a plasma process, said gate dielectric having a physical property defect value associated therewith subsequent to said subjecting; and exposing said gate dielectric to an ultraviolet (UV) energy source to improve said physical property defect value.

16. The method as recited in claim 15 wherein exposing said gate dielectric to an ultraviolet (UV) energy source includes exposing said gate dielectric to an ultraviolet (UV) energy source in a heated environment ranging from about 180° C. to about 400° C.

17. The method as recited in claim 15 wherein exposing said gate dielectric to an ultraviolet (UV) energy source includes exposing said gate dielectric to an ultraviolet (UV) energy source having a broad spectrum of wavelengths ranging from about 190 nm to about 400 nm, with the wavelengths ranging from about 190 nm to about 240 nm providing over about 50% of an energy of said broad spectrum.

18. The method as recited in claim 15 wherein exposing said gate dielectric to an ultraviolet (UV) energy source includes exposing said gate dielectric to an ultraviolet (UV) energy source for a time period ranging from about 8 minutes to about 16 minutes.

19. The method as recited in claim 15 wherein improving said physical property defect value includes improving a negative bias temperature instability (NBTI) value.

20. The method as recited in claim 15 wherein improving said physical property defect value includes improving an antenna gate leakage value.

21. The method as recited in claim 15 wherein improving said physical property defect value includes improving a physical property defect value selected from the group consisting of:

gate oxide integrity (GOI), threshold voltage drift, and $V_{min}$.

22. The method as recited in claim 15 wherein exposing said gate dielectric to an ultraviolet (UV) energy source includes exposing said gate dielectric to an ultraviolet (UV) energy source using an ultraviolet (UV) bulb.

23. The method as recited in claim 15 wherein exposing said gate dielectric to an ultraviolet (UV) energy source includes introducing a gas into said plasma process thereby causing said plasma process to emit said ultraviolet (UV) energy source.

24. The method as recited in claim 23 wherein said gas comprises a gas selected from the group consisting of:

helium, neon, argon, krypton, and xenon.

25. The method as recited in claim 15 further including forming gate electrodes over said gate dielectric and forming a dielectric layer over said gate electrodes, and wherein said exposing includes exposing said gate dielectric to an ultraviolet (UV) energy source through said dielectric layer.

26. The method as recited in claim 25 wherein exposing said gate dielectric to an ultraviolet (UV) energy source includes exposing said gate dielectric to an ultraviolet (UV) energy source at a first time, and further including exposing said gate dielectric to an ultraviolet (UV) energy source at a second later time.

27. The method as recited in claim 26 wherein a number of times the gate dielectric is exposed to said ultraviolet (UV) energy source ranges from about 2 to about 6 times.

28. The method as recited in claim 15 wherein said exposing includes placing said gate dielectric in an additional plasma process, said additional plasma process having a gas therein causing said additional plasma process to emit said ultraviolet (UV) energy source.

29. The method as recited in claim 15 wherein exposing said gate dielectric to an ultraviolet (UV) energy source includes exposing said gate dielectric to an ultraviolet (UV) energy source having a wavelength ranging from about 138 nm to about 400 nm.

30. An integrated circuit manufactured using the method of claim 15.

* * * * *